United States Patent
Liu

(10) Patent No.: US 12,259,433 B2
(45) Date of Patent: Mar. 25, 2025

(54) MOTOR COMMUTATION TESTING CIRCUIT

(71) Applicant: ANPEC ELECTRONICS CORPORATION, Hsinchu (TW)

(72) Inventor: Yi-Cheng Liu, New Taipei (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 243 days.

(21) Appl. No.: 17/966,930

(22) Filed: Oct. 17, 2022

(65) Prior Publication Data
US 2024/0044985 A1    Feb. 8, 2024

(30) Foreign Application Priority Data

Aug. 3, 2022   (TW) .................................. 111129049

(51) Int. Cl.
  *G01R 31/34*   (2020.01)
(52) U.S. Cl.
  CPC .................................. *G01R 31/343* (2013.01)
(58) Field of Classification Search
  CPC .... G01R 31/343; G01R 31/34; G01R 31/346; G01R 31/28; H02P 6/15; H02P 6/22; H02P 6/16; H02P 6/12
  See application file for complete search history.

(56) References Cited

U.S. PATENT DOCUMENTS

| | | | | |
|---|---|---|---|---|
| 2009/0021199 | A1* | 1/2009 | Maeto | H02P 23/0004 318/400.09 |
| 2012/0274252 | A1* | 11/2012 | He | H02P 1/04 318/430 |
| 2013/0015792 | A1* | 1/2013 | Sekihara | H02P 6/14 318/400.1 |
| 2013/0069576 | A1 | 3/2013 | Lee et al. | |
| 2015/0253381 | A1* | 9/2015 | Patel | G01R 31/2848 324/511 |
| 2017/0250634 | A1* | 8/2017 | Ambruson | H02P 6/17 |
| 2021/0067068 | A1 | 3/2021 | Tsai | |

FOREIGN PATENT DOCUMENTS

| | | |
|---|---|---|
| TW | 201315133 A1 | 4/2013 |
| TW | 202110073 A | 3/2021 |

* cited by examiner

*Primary Examiner* — Catherine T. Rastovski
*Assistant Examiner* — Sharad Timilsina
(74) *Attorney, Agent, or Firm* — Li & Cai Intellectual Property (USA) Office

(57) ABSTRACT

A motor commutation testing circuit is provided. When a commutation testing circuit determines that the motor commutation testing circuit enters a test mode, a selector circuit selects a commutation signal generating circuit and provides a simulated commutation signal generated by the commutation signal generating circuit to a control circuit. When the testing circuit determines that the motor commutation testing circuit enters a rotation detection mode, the selector circuit selects a motor rotation detecting circuit and provides a commutation signal of a motor that is detected by the motor rotation detecting circuit to the control circuit.

10 Claims, 3 Drawing Sheets

MOTOR COMMUTATION TESTING CIRCUIT

CROSS-REFERENCE TO RELATED PATENT APPLICATION

This application claims the benefit of priority to Taiwan Patent Application No. 111129049, filed on Aug. 3, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a motor, and more particularly to a motor commutation testing circuit.

BACKGROUND OF THE DISCLOSURE

In electronic devices, fans are used to cool heat generating components such as processors. When the heat generating components are cooled down by the fans, motors of the fans must be accurately controlled to rotate such that the fans can properly cool down the heat generating components with efficiency. However, a conventional motor controller of each of the fan is only suitable for driving one type of motor. The conventional motor controller cannot drive other types of motors having different characteristics to rotate efficiently. In addition, the motor being driven to rotate by the conventional motor controller generates high noise.

SUMMARY OF THE DISCLOSURE

In response to the above-referenced technical inadequacies, the present disclosure provides a motor commutation testing circuit, which is applicable to a motor controller circuit. The motor controller circuit includes a control circuit, a driver circuit and an output stage circuit. The driver circuit is connected to the control circuit and the output stage circuit. The output stage circuit is connected to a motor. The control circuit controls the driver circuit to drive the output stage circuit to operate so as to control a state of the motor. The motor commutation testing circuit includes motor rotation detecting circuit, a commutation signal generating circuit, a commutation testing circuit, and a selector circuit. The motor rotation detecting circuit is connected to the motor. The motor rotation detecting circuit is configured to detect a commutation state of the motor to generate a detected commutation signal. The commutation signal generating circuit is configured to generate a simulated commutation signal. The commutation testing circuit is configured to determine which one of a test mode and a rotation detection mode is a mode that the motor commutation testing circuit enters to output a mode switching signal, according to a mode instruction signal. The selector circuit is connected to the motor rotation detecting circuit, the commutation signal generating circuit, the commutation testing circuit and the control circuit. The selector circuit selects one of the detected commutation signal and the simulated commutation signal according to the mode instruction signal. The selector circuit provides the one of the detected commutation signal and the simulated commutation signal to the control circuit. When the commutation testing circuit determines that the motor commutation testing circuit enters the rotation detection mode, the selector circuit selects the detected commutation signal, and the control circuit controls the driver circuit to drive the output stage circuit according to the detected commutation signal from the selector circuit. When the commutation testing circuit determines that the motor commutation testing circuit enters the test mode, the selector circuit selects the simulated commutation signal, and the control circuit controls the driver circuit to drive the output stage circuit according to the simulated commutation signal from the selector circuit.

In certain embodiments, the commutation signal generating circuit determines a target frequency according to a target rotation speed of the motor. The commutation signal generating circuit generates the simulated commutation signal having the target frequency. When the commutation testing circuit determines that the motor commutation testing circuit enters the test mode, the selector circuit selects the simulated commutation signal having the target frequency. The control circuit controls the driver circuit to drive the output stage circuit according to the simulated commutation signal having the target frequency from the selector circuit.

In certain embodiments, the commutation signal generating circuit stores a plurality of reference target rotation speeds and a plurality of reference frequencies. The plurality of reference frequencies respectively correspond to the plurality of reference target rotation speeds. The commutation signal generating circuit determines a target frequency, according to the reference frequency corresponding to the reference target rotation speed being equal to a target rotation speed of the motor. The commutation signal generating circuit generates the simulated commutation signal having the target frequency.

In certain embodiments, a target rotation speed of the motor is written in a storing component. The commutation signal generating circuit determines a target frequency according to the target rotation speed stored in the storing component. The commutation signal generating circuit outputs the simulated commutation signal having the target frequency to the selector circuit.

In certain embodiments, the storing component includes a register.

In certain embodiments, the commutation testing circuit receives the mode instruction signal through a pin from an external circuit.

In certain embodiments, the commutation testing circuit receives a plurality of pattern signals through a plurality of pins from an external circuit, and uses any one or each one of the plurality of pattern signals as the mode instruction signal.

In certain embodiments, the motor rotation detecting circuit includes a motor rotor detecting circuit. The motor rotor detecting circuit detects a position of a rotor of the motor. The motor rotor detecting circuit determines the commutation state of the motor to output the detected commutation signal according to the position of the rotor of the motor.

In certain embodiments, the commutation signal generating circuit includes an oscillator. The oscillator is configured to output an oscillating signal as the simulated commutation signal.

In certain embodiments, the motor is a single-phase motor or a three-phase motor.

As described above, the present disclosure provides the motor commutation testing circuit. The motor commutation testing circuit of the present disclosure is switched between the rotation detection mode and the test mode. In the rotation detection mode, the motor commutation testing circuit of the present disclosure detects the commutation signal of the motor being driven to rotate, and tests reliability of the motor and the circuit components for driving the motor to rotate according to the commutation signal. However, when the motor cannot rotate to generate the commutation signal due to the fan does not have blades or other factors, the motor commutation testing circuit of the present disclosure enters the test mode. In the test mode, the commutation signal generating circuit such as the oscillator of the motor commutation testing circuit of the present disclosure generates the simulated commutation signal. In the test mode, the motor commutation testing circuit of the present disclosure tests the reliability of the motor and the circuit components for driving the motor to rotate, according to the simulated commutation signal.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
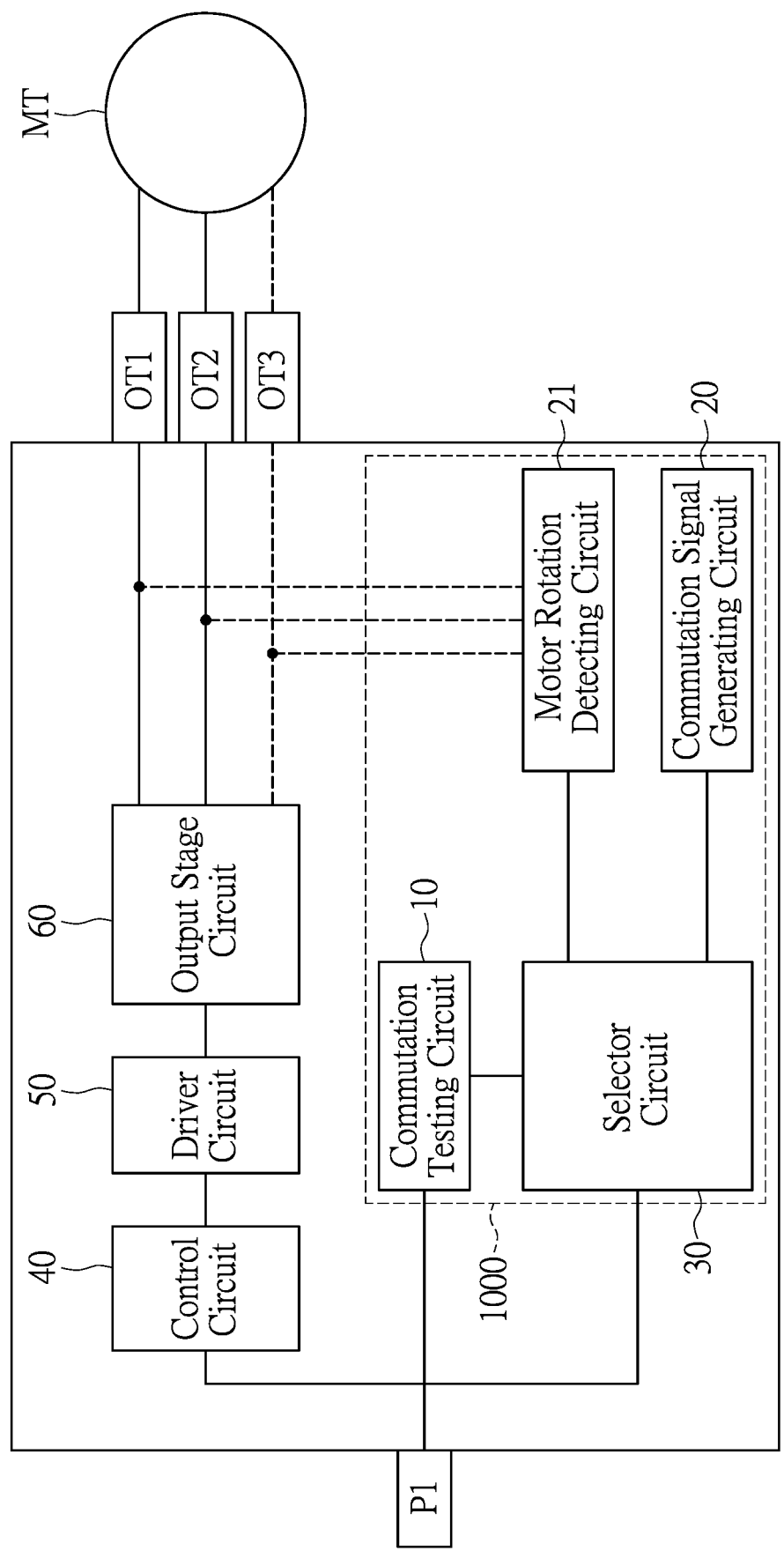
FIG. 1 is a block diagram of a motor, a control circuit, a driver circuit, an output stage circuit and a motor commutation testing circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
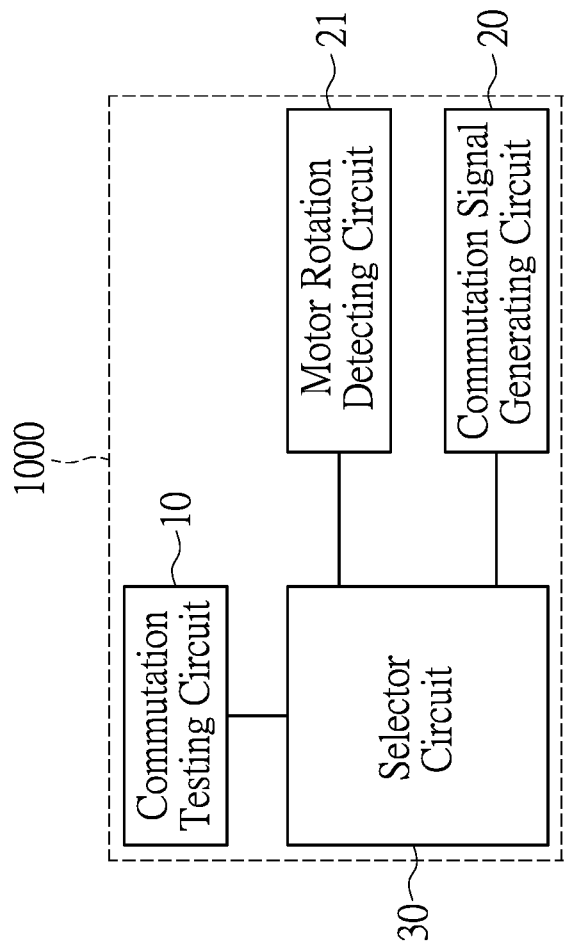
FIG. 2 is a block diagram of the motor commutation testing circuit according to the embodiment of the present disclosure.
Figure 3:
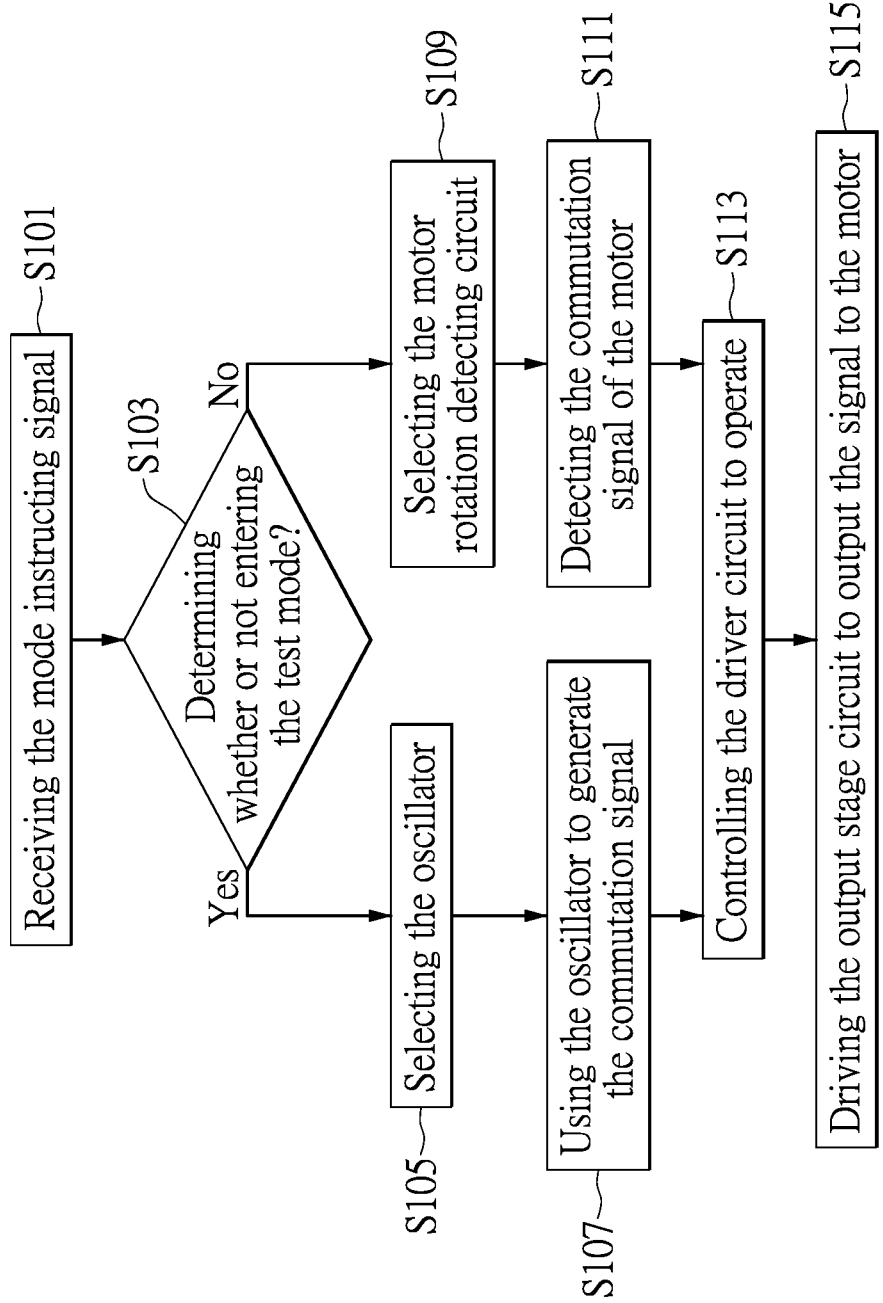
FIG. 3 is a flowchart diagram of the motor commutation testing circuit according to the embodiment of the present disclosure.

Reference is made to FIGS. 1 to 3, in which FIG. 1 is a block diagram of a motor, a control circuit, a driver circuit, an output stage circuit and a motor commutation testing circuit according to an embodiment of the present disclosure, FIG. 2 is a block diagram of the motor commutation testing circuit according to the embodiment of the present disclosure, and FIG. 3 is a flowchart diagram of the motor commutation testing circuit according to the embodiment of the present disclosure.

As shown in FIG. 1, a motor commutation testing circuit 1000 of the embodiment of the present disclosure is suitable for testing a state such as reliability of a motor MT and a motor controller circuit. The motor controller circuit may include a control circuit 40, a driver circuit 50 and an output stage circuit 60 as shown in FIG. 1.

In the motor controller circuit, the driver circuit 50 is connected to the control circuit 40 and the output stage circuit 60. The output stage circuit 60 is connected to the motor MT.

It is worth noting that, the motor commutation testing circuit 1000 of the embodiment of the present disclosure may include a commutation testing circuit 10, a commutation signal generating circuit 20, a motor rotation detecting circuit 21 and a selector circuit 30 as shown in FIGS. 1 and 2.

The motor rotation detecting circuit 21 of the motor commutation testing circuit 1000 of the embodiment of the present disclosure may be connected to a first terminal OT1 and a second terminal OT2 of the motor MT such as a single-phase motor, or may be connected to the first terminal OT1, the second terminal OT2 and a third terminal OT3 of the motor MT such as a three-phase motor.

The commutation testing circuit 10 may be connected to the selector circuit 30 and an external circuit. The selector circuit 30 is connected to the commutation signal generating circuit 20, the motor rotation detecting circuit 21 and the control circuit 40.

First, in step S101 of FIG. 3, the commutation testing circuit 10 may receive a mode instruction signal from the external circuit through a pin P1 of the motor controller circuit as shown in FIG. 1. In practice, the commutation testing circuit 10 may receive one or more pattern signals from the external circuit through one or more pins such as an SCL pin and an SDA pin that are applicable to an I2C protocol, and uses any one or each one of the pattern signals as the mode instruction signal. It should be understood that, the present disclosure is not limited to a source of the mode instruction signal.

Then, in step S103 of FIG. 3, the commutation testing circuit 10 may, according to the mode instruction signal, determine which one of a test mode and a rotation detection mode is a mode that the motor commutation testing circuit 1000 of the embodiment of the present disclosure enters.

It is worth noting that, when the motor MT cannot commutate to generate a commutation signal due to not all of components (such as blades) of a fan are assembled together, the blades of the fan are not driven by the motor MT yet or other factors, the mode instruction signal received by the commutation testing circuit 10 has a test mode message. The commutation testing circuit 10, according to the mode instruction signal having the test mode message, determines that the motor commutation testing circuit 1000 of the embodiment of the present disclosure enters the test mode to output a mode switching signal having the test mode message.

In the test mode, the motor commutation testing circuit 1000 of the embodiment of the present disclosure performs testing operations of steps S105 to S107, S113 and S115, as described in detail in the following.

In step S105 of FIG. 3, in the test mode, the selector circuit 30, according to the mode switching signal having the test mode message from the commutation testing circuit 10, selects the commutation signal generating circuit 20 among the motor rotation detecting circuit 21 and the commutation signal generating circuit 20.

In step S107 of FIG. 3, in the test mode, the commutation signal generating circuit 20 generates a simulated commutation signal. For example, the commutation signal generating circuit 20 may include an oscillator or other circuit components. The oscillator is configured to generate an oscillating signal as the simulated commutation signal.

If necessary, in the test mode, the commutation signal generating circuit 20 may determine a target frequency according to a target rotation speed of the motor MT, and may output the simulated commutation signal having the target frequency. The target rotation speed of the motor MT may be written in a storing component such as a register (through the one or more pins of the motor controller circuit, such as the SCL pin and the SDA pin that are applicable to the I2C protocol) from the external circuit. The commutation signal generating circuit 20 may determine the target frequency according to the target rotation speed stored in the storing component, and may output the simulated commutation signal having the target frequency.

For example, in the test mode, the commutation signal generating circuit 20 may store a plurality of reference target rotation speeds and a plurality of reference frequencies on a lookup table. The plurality of reference frequencies respectively correspond to the plurality of reference target rotation speeds. The commutation signal generating circuit 20 may look up one of the plurality of reference frequencies that corresponds to the reference target rotation speed being equal to the target rotation speed of the motor MT. The commutation signal generating circuit 20 may determine that the target frequency is equal to the one of the plurality of reference frequencies. The commutation signal generating circuit 20 outputs the simulated commutation signal having the target frequency. The target frequency of the simulated commutation signal is equal to the one of the plurality of reference frequencies that corresponds to the target rotation speed.

In the test mode, the selector circuit 30 obtains and transmits the simulated commutation signal from the commutation signal generating circuit 20 such as the oscillator to the control circuit 40.

After step S107 of FIG. 3 is performed, step S113 of FIG. 3 is performed. In step S113 of FIG. 3, in the test mode, the control circuit 40 receives the simulated commutation signal through the selector circuit 30 from the commutation signal generating circuit 20 such as the oscillator, and outputs a control signal to the driver circuit 50 according to the simulated commutation signal. The driver circuit 50 outputs a driving signal to the output stage circuit according to the control signal from the control circuit 40.

Then, in step S115 of FIG. 3, in the test mode, the output stage circuit (including a bridge circuit having a plurality of high-side switches and a plurality of low-side switches) operates to output an output stage signal to the motor MT to control the state of the motor MT, according to the driving signal from the driver circuit 50.

After the above-mentioned testing operations are performed in the test mode, the reliability and other states of circuit components such as coils of the motor MT, the control circuit 40, the driver circuit 50 and the output stage circuit 60 may be determined according to operational state data such as signals that are outputted by these circuit components.

When the motor MT rotates and commutates to generate the commutation signal, the commutation testing circuit 10 receives the mode instruction signal having a motor rotating detected message from the external circuit. The commutation testing circuit 10, according to the mode instruction signal having the motor rotating detected message, determines that the motor commutation testing circuit 1000 of the embodiment of the present disclosure enters the rotation detection mode to output the mode switching signal having the motor rotating detected message.

In the rotation detection mode, the motor commutation testing circuit 1000 of the embodiment of the present disclosure performs detection operations of steps S109 to S115, as described in detail in the following.

In step S109 of FIG. 3, in the rotation detection mode, the selector circuit 30, according to the mode switching signal having the motor rotating detected message from the commutation testing circuit 10, selects the motor rotation detecting circuit 21 among the commutation signal generating circuit 20 and the motor rotation detecting circuit 21.

In step S111 of FIG. 3, in the rotation detection mode, the motor rotation detecting circuit 21 detects the commutation state of the motor MT to generate the commutation signal as the detected commutation signal.

For example, the motor rotation detecting circuit 21 may include a motor rotor detecting circuit such as but not limited to a Hall sensor. The motor rotation detecting circuit 21 may detect a position of a rotor of the motor MT. Then, the motor rotation detecting circuit 21 may, according to a change in the position of the rotor of the motor MT, determine the commutation state of the motor MT to generate the commutation signal as the detected commutation signal. The selector circuit 30 transmits the detected commutation signal from the motor rotation detecting circuit 21 to the control circuit 40.

After step S111 of FIG. 3 is performed, step S113 is performed. In step S113, in the rotation detection mode, the control circuit 40 outputs the control signal according to the detected commutation signal from the selector circuit 30.

Then, in step S113 of FIG. 3, the output stage circuit 60 (including the bridge circuit having the plurality of high-side switches and the plurality of low-side switches) operates to output the output stage signal to the motor MT to control the state of the motor MT, according to the driving signal from the driver circuit 50.

After the above-mentioned detection operations are performed in the rotation detection mode, the reliability and other states of circuit components such as the coils of the motor MT, the control circuit 40, the driver circuit 50 and the output stage circuit 60 may be determined according to the operational state data such as the signals that are outputted by these circuit components.

That is, when the motor MT cannot generate the commutation signal, the commutation signal generating circuit 20 generates the commutation signal (for example, the oscillator generates the oscillating signal) as the simulated commutation signal, and then the selector circuit 30 selects to transmit the simulated commutation signal from the commutation signal generating circuit 20 to the control circuit 40 for testing.

However, when the motor MT rotates and commutates to generate the commutation signal, the motor rotation detecting circuit 21 detects the commutation signal of the motor MT as the detected commutation signal, and then the selector circuit 30 selects to transmit the detected commutation signal from the motor rotation detecting circuit 21 to the control circuit 40.

In brief, the selector circuit 30 (, according to the operational state of the motor MT,) selects one of the commutation signal generating circuit 20 and the motor MT for generating the commutation signal. Performance (such as the reliability) of the motor MT and the motor controller circuit are tested according to the commutation signal.

Beneficial Effects of the Embodiments

In conclusion, the present disclosure provides the motor commutation testing circuit. The motor commutation testing circuit of the present disclosure is switched between the rotation detection mode and the test mode. In the rotation detection mode, the motor commutation testing circuit of the present disclosure detects the commutation signal of the motor being driven to rotate, and tests the reliability of the motor and the circuit components for driving the motor to rotate according to the commutation signal.

However, when the motor cannot rotate to generate the commutation signal due to the fan does not have blades or other factors, the motor commutation testing circuit of the present disclosure enters the test mode. In the test mode, the commutation signal generating circuit such as the oscillator of the motor commutation testing circuit of the present disclosure generates the simulated commutation signal. In the test mode, the motor commutation testing circuit of the present disclosure tests the reliability of the motor and the circuit components for driving the motor to rotate, according to the simulated commutation signal.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A motor commutation testing circuit, which is applicable to a motor controller circuit, wherein the motor controller circuit includes a control circuit, a driver circuit and an output stage circuit, the driver circuit is connected to the control circuit and the output stage circuit, the output stage circuit is connected to a motor, and the control circuit controls the driver circuit to drive the output stage circuit to operate so as to control a state of the motor, the motor commutation testing circuit comprising:
   a motor rotation detecting circuit connected to the motor, and configured to detect a commutation state of the motor to generate a detected commutation signal;
   a commutation signal generating circuit configured to generate a simulated commutation signal;
   a commutation testing circuit configured to determine which one of a test mode and a rotation detection mode is a mode that the motor commutation testing circuit enters to output a mode switching signal, according to a mode instruction signal from an external circuit; and
   a selector circuit connected to the motor rotation detecting circuit, the commutation signal generating circuit, the commutation testing circuit and the control circuit, wherein the selector circuit selects one of the detected commutation signal and the simulated commutation signal according to the mode instruction signal, and the selector circuit provides the one of the detected commutation signal and the simulated commutation signal to the control circuit;
   wherein, when the motor is unable to commutate to generate a commutation signal, the commutation testing circuit receives the mode instruction signal having a test mode message from the external circuit, the commutation testing circuit determines that the motor commutation testing circuit enters the test mode to output the mode switching signal having the test mode message according to the mode instruction signal having the test mode message, and the selector circuit selects the simulated commutation signal among the detected commutation signal and the simulated commutation signal according to the mode switching signal having the test mode message from the commutation testing circuit;
   wherein, when the motor rotates and commutates to generate the commutation signal, the commutation testing circuit receives the mode instruction signal having a motor rotating detected message from the external circuit, the commutation testing circuit determines that the motor commutation testing circuit enters the rotation detection mode to output the mode switching signal having the motor rotating detected message according to the mode instruction signal having the motor rotating detected message, and the selector circuit selects the detected commutation signal among the detected commutation signal and the simulated commutation signal according to the mode switching signal having the motor rotating detected message from the commutation testing circuit;
   wherein, when the selector circuit selects the detected commutation signal, the control circuit controls the driver circuit to drive the output stage circuit according to the detected commutation signal from the selector circuit;
   wherein, when the selector circuit selects the simulated commutation signal, the control circuit controls the driver circuit to drive the output stage circuit according to the simulated commutation signal from the selector circuit.

2. The motor commutation testing circuit according to claim 1, wherein the commutation signal generating circuit determines a target frequency according to a target rotation speed of the motor, and generates the simulated commutation signal having the target frequency;
   wherein, when the commutation testing circuit determines that the motor commutation testing circuit enters the test mode, the selector circuit selects the simulated commutation signal having the target frequency, and the control circuit controls the driver circuit to drive the output stage circuit according to the simulated commutation signal having the target frequency from the selector circuit.

3. The motor commutation testing circuit according to claim 1, wherein the commutation signal generating circuit stores a plurality of reference target rotation speeds and a plurality of reference frequencies, the plurality of reference frequencies respectively correspond to the plurality of reference target rotation speeds, the commutation signal generating circuit determines a target frequency according to the reference frequency corresponding to the reference target rotation speed being equal to a target rotation speed of the motor, and the commutation signal generating circuit generates the simulated commutation signal having the target frequency.

4. The motor commutation testing circuit according to claim 1, wherein a target rotation speed of the motor is written in a storing component, the commutation signal generating circuit determines a target frequency according to the target rotation speed stored in the storing component, and the commutation signal generating circuit outputs the simulated commutation signal having the target frequency to the selector circuit.

5. The motor commutation testing circuit according to claim 4, wherein the storing component includes a register.

6. The motor commutation testing circuit according to claim 1, wherein the commutation testing circuit receives the mode instruction signal through a pin from an external circuit.

7. The motor commutation testing circuit according to claim 1, wherein the commutation testing circuit receives a plurality of pattern signals through a plurality of pins from an external circuit, and uses any one or each one of the plurality of pattern signals as the mode instruction signal.

8. The motor commutation testing circuit according to claim 1, wherein the motor rotation detecting circuit includes a motor rotor detecting circuit, the motor rotor detecting circuit detects a position of a rotor of the motor, and the motor rotor detecting circuit determines the commutation state of the motor to output the detected commutation signal according to the position of the rotor of the motor.

9. The motor commutation testing circuit according to claim 1, wherein the commutation signal generating circuit includes an oscillator configured to output an oscillating signal as the simulated commutation signal.

10. The motor commutation testing circuit according to claim 1, wherein the motor is a single-phase motor or a three-phase motor.

* * * * *